US012654317B2

(12) United States Patent
Imanishi et al.

(10) Patent No.: US 12,654,317 B2
(45) Date of Patent: Jun. 16, 2026

(54) CONTROL DEVICE FOR SUBSTRATE TRANSFER ROBOT AND CONTROL METHOD FOR JOINT MOTOR

(71) Applicant: KAWASAKI JUKOGYO KABUSHIKI KAISHA, Kobe (JP)

(72) Inventors: Hiroki Imanishi, Kobe (JP); Shinya Kitano, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 46 days.

(21) Appl. No.: 18/715,227

(22) PCT Filed: Dec. 2, 2022

(86) PCT No.: PCT/JP2022/044640
§ 371 (c)(1),
(2) Date: May 31, 2024

(87) PCT Pub. No.: WO2023/101027
PCT Pub. Date: Jun. 8, 2023

(65) Prior Publication Data

US 2025/0026013 A1 Jan. 23, 2025

(30) Foreign Application Priority Data

Dec. 3, 2021 (JP) ................................. 2021-197404

(51) Int. Cl.
*B25J 9/16* (2006.01)
*B25J 11/00* (2006.01)
*H01L 21/687* (2006.01)

(52) U.S. Cl.
CPC ......... *B25J 9/1651* (2013.01); *B25J 11/0095* (2013.01); *H01L 21/68707* (2013.01)

(58) Field of Classification Search
CPC ...... B25J 9/1651; B25J 11/0095; B25J 13/00; B25J 13/08; B25J 9/10; B25J 9/1692;
(Continued)

(56) References Cited

U.S. PATENT DOCUMENTS 5,708,342 A 1/1998 Nihei et al.
5,980,194 A 11/1999 Freerks et al.
(Continued)

FOREIGN PATENT DOCUMENTS

JP H06-260548 A 9/1994
JP 6640321 B2 2/2020

OTHER PUBLICATIONS

Feb. 21, 2023 International Search Report issued in International Patent Application No. PCT/JP2022/044640.

*Primary Examiner* — Kira Nguyen
(74) *Attorney, Agent, or Firm* — Oliff PLC

(57) ABSTRACT

A control device controls a substrate transfer robot including a hand, a joint, and a joint motor. The control device modifies a target position of the hand when it places substrate at transfer destination, based on positional misalignment information indicating misalignment of substrate. To change a position at which the hand places the substrate to target position after modification, the control device performs first velocity control and second velocity control. In first velocity control, velocity of hand that is approaching target position before modification with the velocity decreasing is made constant by correcting. In second velocity control, velocity of hand decreases by slope equal to the slope of velocity of the hand immediately before first velocity control and hand is stopped at target position after modification. Time during which the first velocity control is performed increases as a magnitude of change in the target position due to the modification increases.

6 Claims, 9 Drawing Sheets

(58) Field of Classification Search
CPC ........ B25J 9/04; B25J 9/1664; B25J 15/0014;
H01L 21/68707; H01L 21/677; H01L
21/68; H01L 21/67742
USPC ........................................................ 700/253
See application file for complete search history.

(56) References Cited

U.S. PATENT DOCUMENTS

| | | | |
|---|---|---|---|
| 6,646,715 B1 * | 11/2003 | Makinouchi ........... | G03B 27/42 |
| | | | 356/399 |
| 9,908,236 B2 * | 3/2018 | Minami ............ | H01L 21/67766 |
| 2019/0295873 A1 * | 9/2019 | Hirochi ............ | H01L 21/67742 |
| 2020/0354161 A1 * | 11/2020 | Yoshida ................... | B25J 15/10 |
| 2020/0411347 A1 * | 12/2020 | Kopec ................... | G06T 1/0014 |

* cited by examiner

7p

7

2

(x1+Δx1, y1+Δy1)

(x1, y1)

(mx, my)

(Δx1, Δy1)

P0

10

41

4 c3

11

16

D1

Y

X

7

A1

7p

2

(x1+Δx1, y1+Δy1)

P1

(x1, y1)

(Δx1, Δy1)

(mx, my)

10

P0

41

4 c3

11

16

D1

Y

X second embodiment second embodiment

CONTROL DEVICE FOR SUBSTRATE TRANSFER ROBOT AND CONTROL METHOD FOR JOINT MOTOR

TECHNICAL FIELD

The present disclosure relates to control of a substrate transfer robot.

BACKGROUND ART

In a substrate transfer system, a configuration that, if positional misalignment occurs on a substrate to be transferred, can eliminate the positional misalignment by changing the position of the hand when placing the substrate, has been known.

PTL 1 discloses a substrate transfer method in which a disc-shaped substrate is transferred to a substrate processing chamber by a transfer means. In PTL 1, a sensor pair detects the passage of the outer edge of a wafer being transferred to the substrate processing chamber, respectively, and thereby detects positional misalignment of the wafer. Based on the acquired positional misalignment, the target position is modified, thus modifying the wafer transfer path.

PRIOR-ART DOCUMENTS

Patent Documents

PTL 1: Japanese Patent No. 6640321

SUMMARY OF THE INVENTION

Problems to be Solved by the Invention

In PTL 1, the modification of the wafer transfer path is performed over the period from after the positional misalignment of the wafer is acquired to the time when the wafer reaches the modified target position. However, there is no disclosure in PTL 1 as to how the modification is performed specifically.

The present disclosure is made in view of the above circumstances, and the purpose of the present disclosure is to eliminate positional misalignment of a substrate in a substrate transfer robot and accurately place the substrate at a predetermined position while suppressing a hand velocity fluctuation and the like.

Means for Solving the Problems

The problem to be solved by the present disclosure is as described above, and next, means for solving the problem and effects thereof will be described.

According to the first aspect of the present disclosure, a control device of a substrate transfer robot with the following configuration is provided. That is, the control device controls the substrate transfer robot including a hand, a joint, and a joint motor. The hand can hold a substrate. An axis of the joint is oriented in a vertical direction. The joint motor drives the joint. The control device modifies a target position of the hand when the substrate is placed at a transfer destination, based on positional misalignment information indicating misalignment of the substrate held by the hand. To change a position at which the hand places the substrate to the target position after the modification, the control device performs first velocity control and second velocity control. In the first velocity control, velocity of the hand that is approaching the target position before the modification with the velocity decreasing is made constant by correcting. In the second velocity control, the velocity of the hand is made to decrease by a slope equal to a slope of the velocity of the hand immediately before the first velocity control and the hand is stopped at the target position after the modification. Time during which the first velocity control is performed increases as a magnitude of change in the target position due to the modification increases.

This allows the hand to place the substrate at an accurate position of the transfer destination by eliminating the positional misalignment while suppressing a velocity fluctuation of the hand.

According to the second aspect of the present disclosure, a control device of a substrate transfer robot with the following configuration is provided. That is, the control device controls the substrate transfer robot including a hand, a joint, and a joint motor. The hand can hold a substrate. An axis of the joint is oriented in a vertical direction. The joint motor drives the joint. The control device modifies a target position of the hand when the substrate is placed at a transfer destination, based on positional misalignment information indicating misalignment of the substrate held by the hand. To change the position at which the hand places the substrate to the target position after the modification, the control device adds a velocity correction function, being a time function of a velocity correction value, to velocity of the hand. The velocity correction function includes a first period and a second period. During the first period, the velocity correction value is zero at a start time point of correcting and increases linearly from zero as time elapses. During the second period, the velocity correction value decreases linearly from the velocity correction value at an end time point of the first period to zero at an end time point of the correcting as time elapses. The end time point of the correcting is simultaneous with a time point at which the velocity of the hand before the correcting reaches zero. A slope of the velocity increasing in the first period becomes steeper and a slope of the velocity decreasing in the second period becomes steeper as a magnitude of change in the target position due to the modification increases.

This allows the substrate to be placed at an accurate position of the transfer destination by preventing the positional misalignment while suppressing a decrease in transfer throughput.

Effects of the Invention

According to this disclosure, a substrate transfer robot can eliminate positional misalignment and accurately place a substrate at a predetermined position while suppressing a hand velocity fluctuation and the like.

EMBODIMENT FOR CARRYING OUT THE INVENTION

Figure 1:
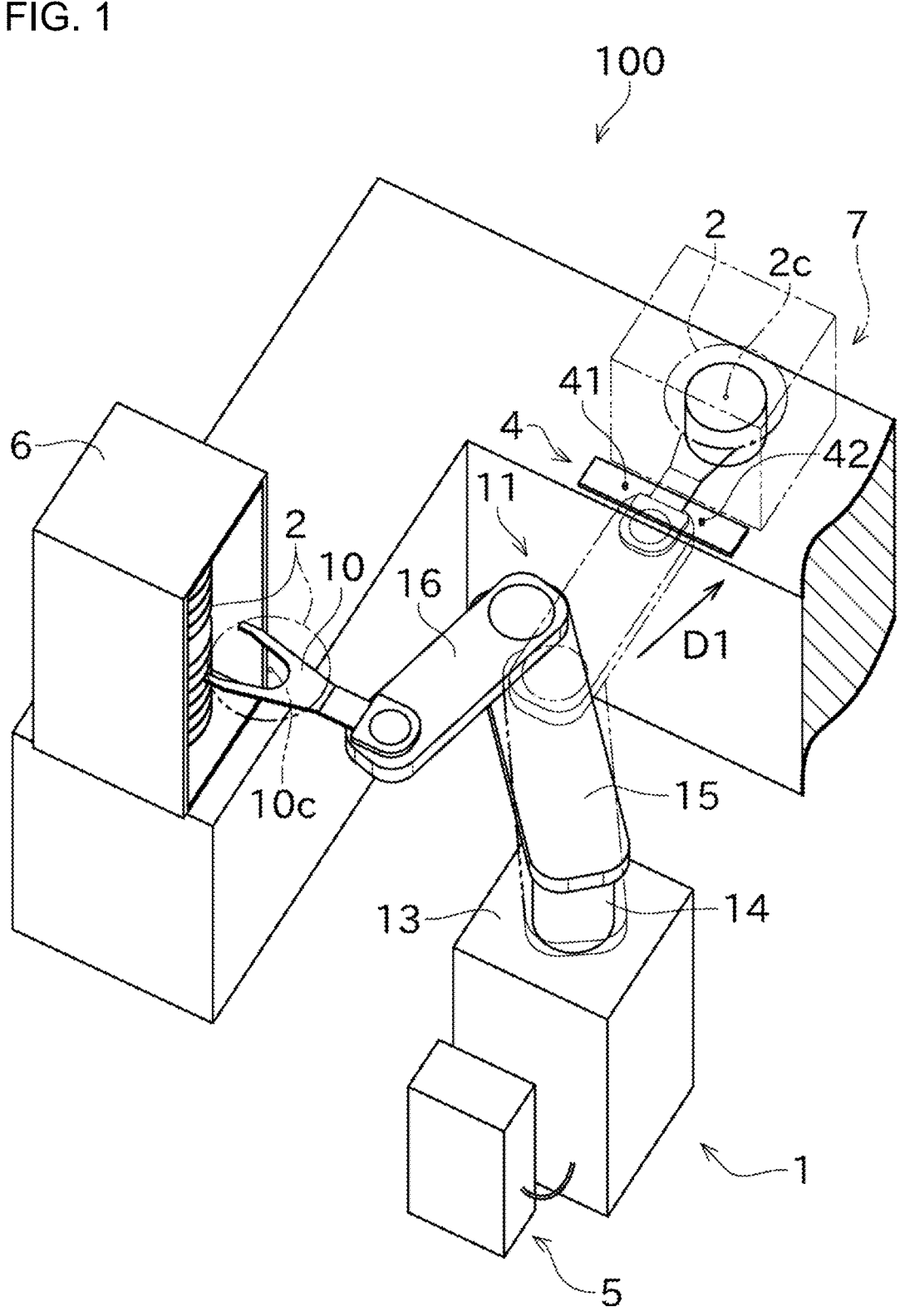
FIG. 1 is a diagonal view showing an overall configuration of a robot system according to one embodiment of this disclosure.
Figure 2:
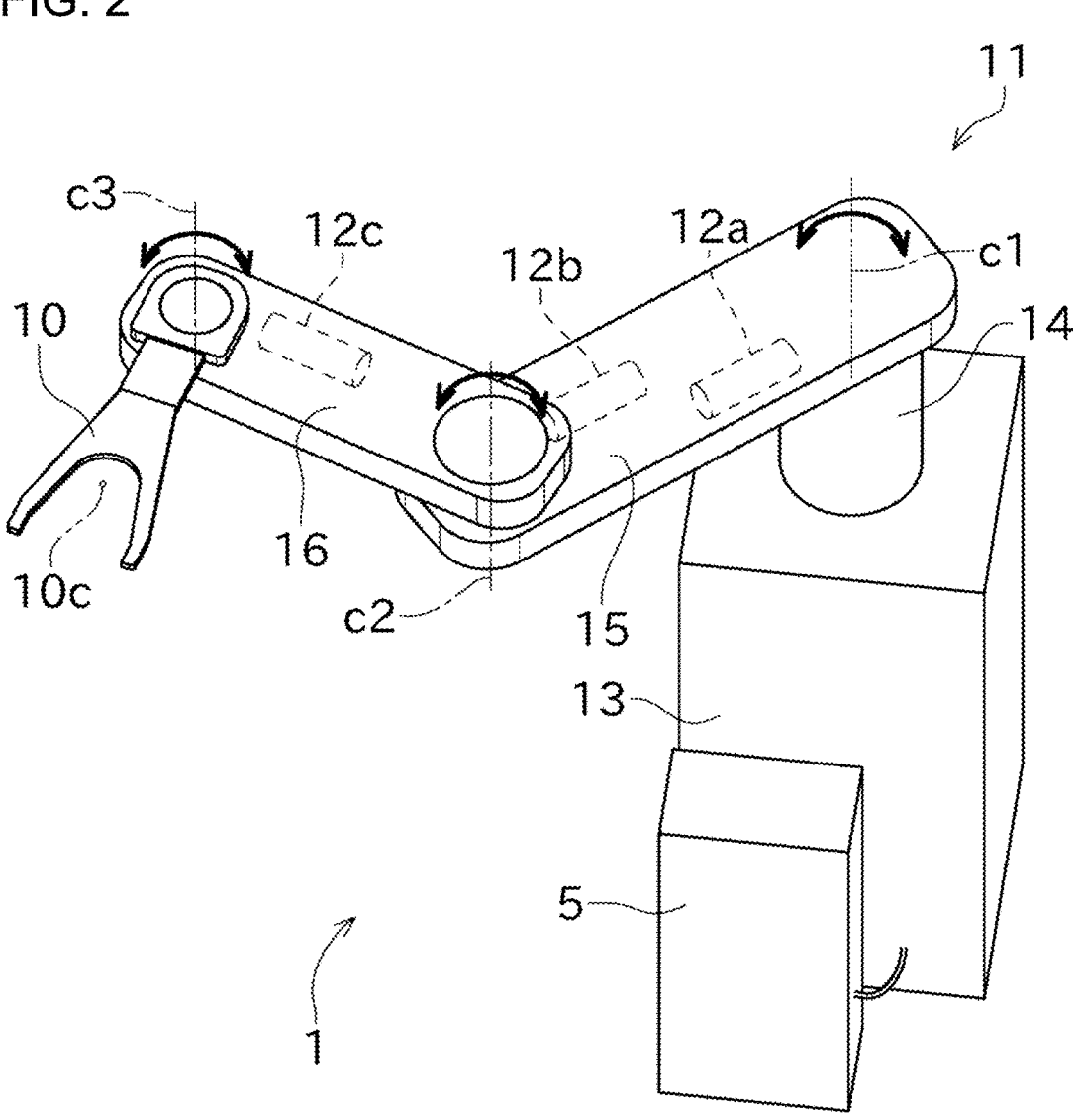
FIG. 2 is a diagonal view showing the configuration of the robot.
Figure 3:
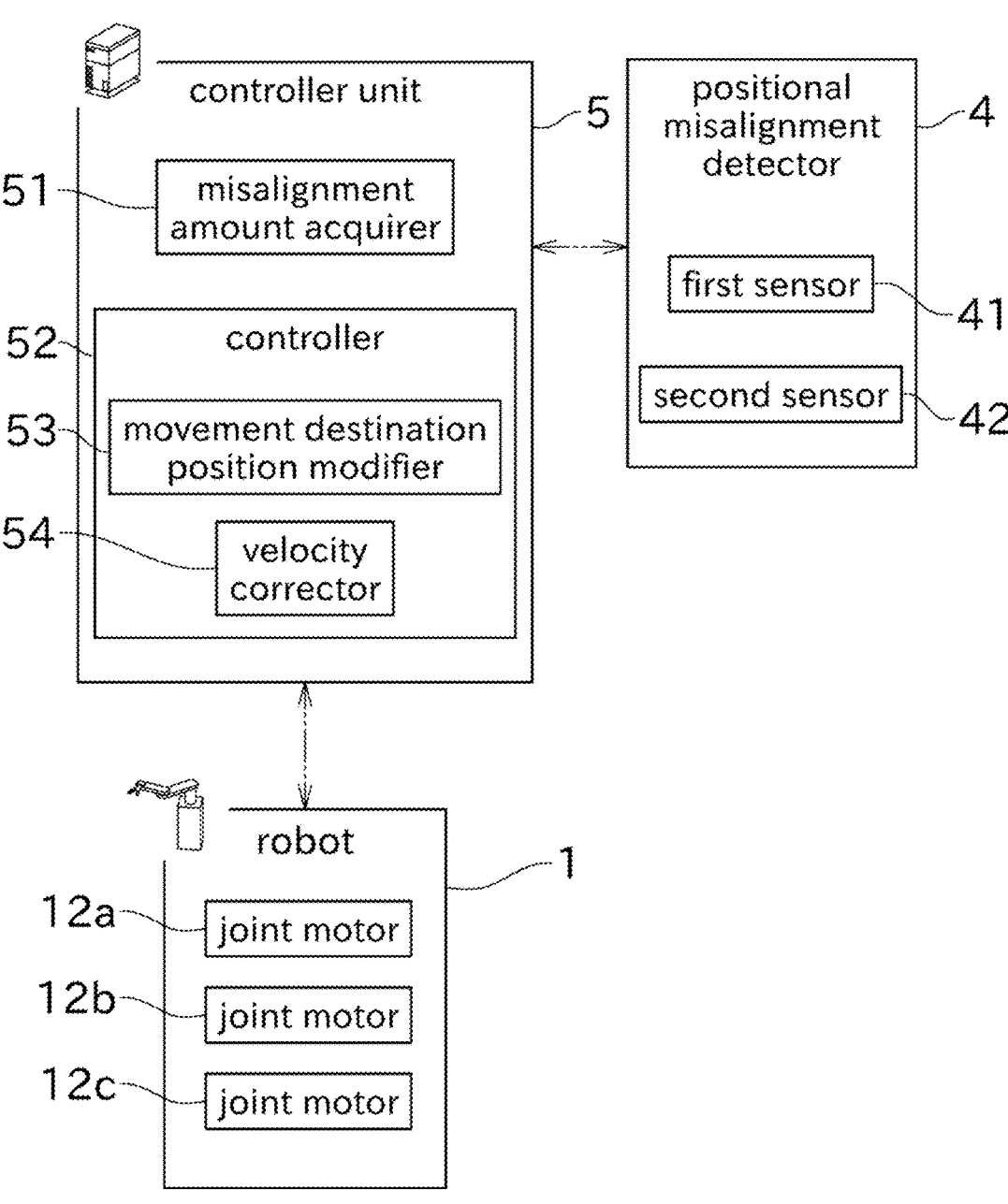
FIG. 3 is a block diagram showing an electrical configuration with respect to a controller unit.

The following is a description of the disclosed embodiments with reference to the drawings. FIG. 1 is a diagonal view showing a configuration of a robot system 100 according to one embodiment of this disclosure. FIG. 2 is a diagonal view of a robot 1. FIG. 3 is a block diagram showing a part of the robot system 100.

The robot system 100 shown in FIG. 1 is a system to make the robot (substrate transfer robot) 1 perform work in a clean room or other work space.

The robot system 100 has a robot 1, a positional misalignment detector 4, and a controller unit (control device) 5.

The robot 1 functions, for example, as a wafer transfer robot that transfers a wafer 2 stored in a storage container 6 to a substrate processing chamber 7. In this embodiment, the robot 1 is realized by a SCARA (SCARA) type horizontal articulated robot. SCARA is an abbreviation for Selective Compliance Assembly Robot Arm.

The wafer 2 transferred by the robot 1 is a type of substrate. The wafer 2 is formed as a thin circular plate.

The robot 1 has a hand (holding unit) 10, a manipulator 11, and joint motors 12a, 12b, 12c, as shown in FIG. 2.

The hand 10 is a type of end effector and is generally V-shaped or U-shaped in a plan view. The hand 10 is supported at an end of the manipulator 11 (specifically, a second link 16 which will be described later). The hand 10 rotates about a third axis c3 extending in a vertical direction with respect to the second link 16.

The wafer 2 can be placed on the hand 10. A reference position is defined with respect to the hand 10, and when the wafer 2 is placed on the predetermined position of the hand 10 without any positional misalignment, a center 2c of the wafer 2 coincides with the reference position of the hand 10. This reference position may hereinafter be referred to as a center 10c of the hand 10.

The manipulator 11 is mainly equipped with a base 13, an elevation shaft 14, a first link 15, and the second link 16.

The base 13 is fixed to the ground (for example, a floor of the clean room). The base 13 serves as a base member supporting the elevation shaft 14.

The elevation shaft 14 moves vertically with respect to the base 13. This vertical movement allows the elevation of the first link 15, the second link 16, and the hand 10 to be changed.

The first link 15 is supported on an upper part of the elevation shaft 14. The first link 15 rotates about a first axis c1 extending in a vertical direction with respect to the elevation shaft 14. This allows the posture of the first link 15 to be changed within the horizontal plane.

The second link 16 is supported at an end of the first link 15. The second link 16 rotates about a second axis c2 extending in a vertical direction with respect to the first link 15. This allows the posture of the second link 16 to be changed within the horizontal plane.

Thus, the manipulator 11 includes three joints, each axis of which is oriented in a vertical direction. In the following, each joint may be referred to with the reference sign c1, c2, c3 of the central axis to identify it.

The joint motors 12a, 12b, 12c drive joints c1, c2, c3, respectively. This allows the position and posture of the hand 10 in a plan view to be changed in various ways. Each of the joint motors 12a, 12b, 12c is configured as a servo motor which is a type of electric motor.

The joint motor 12a, which drives the joint c1, is located at the first link 15. The joint motor 12b, which drives the joint c2, is located at the first link 15. The joint motor 12c, which drives the joint c3, is located at the second link 16. However, the layout of each motor is not limited to the above.

The positional misalignment detector 4 has a first sensor 41 and a second sensor 42. Each of the first sensor 41 and the second sensor 42 is located near a path along which the wafer 2 is transferred by the robot 1 to the substrate processing chamber 7. Just before the hand 10 reaches the substrate processing chamber 7, which is the destination of the movement, the hand 10 and the wafer 2 generally move in a direction D1 shown in FIG. 1. The positional misalignment detector 4 is located in the vicinity of the substrate processing chamber 7 and on the opposite side of the direction D1 in relation to the substrate processing chamber 7. The first sensor 41 and the second sensor 42 can detect the passage of an outer edge of the wafer 2 on the way the wafer 2 is transferred to the substrate processing chamber 7.

The first sensor 41 and the second sensor 42 are both configured as non-contact sensors. The configuration of the sensors is arbitrary, but they can be configured, for example, as reflective sensors. Instead of reflective sensors, for example, transmissive sensors may be applied.

Since the configuration of the positional misalignment detector 4 is disclosed in PTL 1, etc., it will be briefly described below. The first sensor 41 and the second sensor 42 are positioned suitably far apart in the plan view to form an interval smaller than a diameter of the wafer 2. Each of the first sensor 41 and the second sensor 42 is arranged with its detection axis oriented in a vertical direction.

Each of the first sensor 41 and the second sensor 42 can detect the passage of the outer edge of the wafer 2. The detection results of the first sensor 41 and the second sensor 42 are input to the controller unit 5. The center position of the hand 10 at the timing when the first sensor 41 and the second sensor 42 detect the passage of the outer edge of the wafer 2 can be acquired by the controller unit 5, for example, by encoders (not shown) provided at the joint motors 12a, 12b, 12c.

Figure 4:
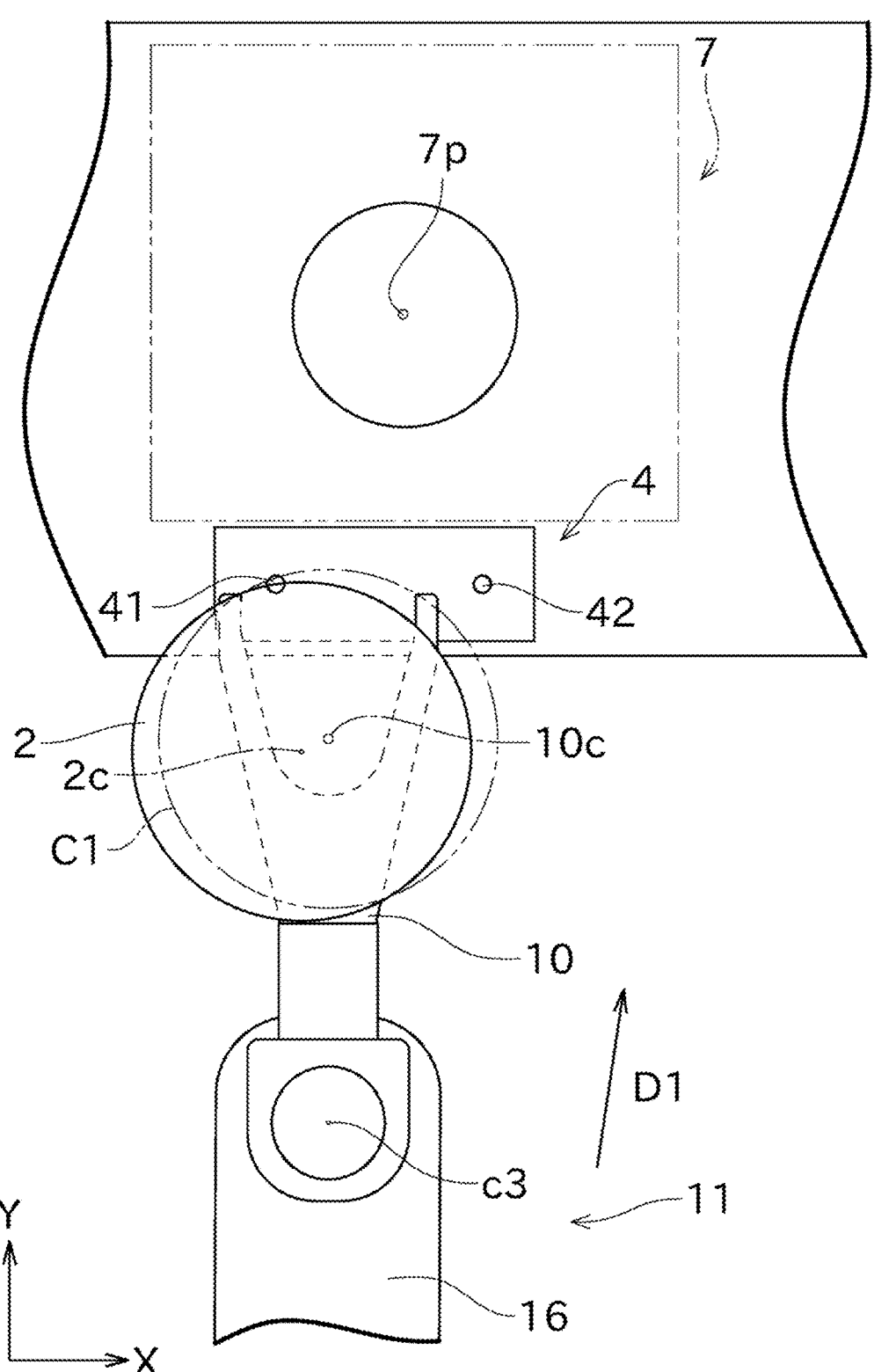
FIG. 4 is a plan view showing a state in which a first sensor of a positional misalignment detector detects a first passage of an outer edge of a wafer.
Figure 5:
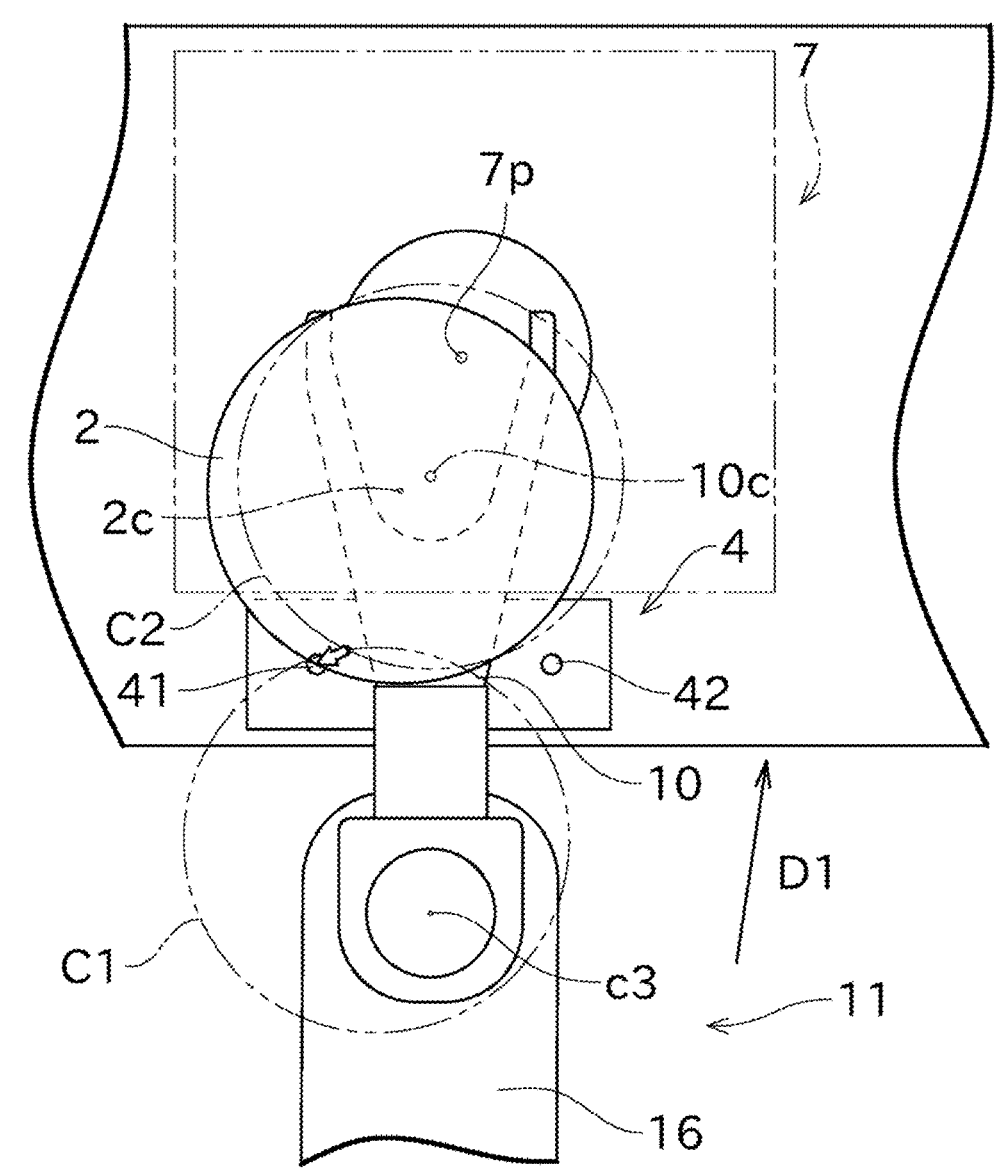
FIG. 5 is a plan view showing a state in which the first sensor of the positional misalignment detector detects a second passage of the outer edge of the wafer.
Figure 5:
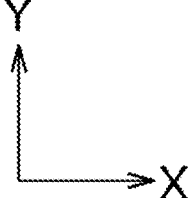

During the wafer 2 being transferred along the path, the first sensor 41 can detect the passage of the outer edge of the wafer 2 twice. The first detection is shown in FIG. 4 and the second detection is shown in FIG. 5. At each of the two passage timings, the controller unit 5 computes the center position of the hand 10.

Here, a two-dimensional plane corresponding to the plan view of the transfer path of the wafer 2 is defined. The position in the two-dimensional plane can be expressed in a two-dimensional Cartesian coordinate system, as shown in FIGS. 4 and 5. In this two-dimensional plane, consider two virtual circles centered at the two centers 10$c$ acquired above with respect to the hand 10, whose diameters are equal to the diameter of the wafer 2. The diameter of the wafer 2 is known. The reference sign C1 in FIG. 4 is the virtual circle based on the first detection, and the reference sign C2 in FIG. 5 is the virtual circle based on the second detection. In FIG. 5, the virtual circle C1 based on the first detection is depicted together with the virtual circle C2 based on the second detection.

There are two intersection points of the two virtual circles C1 and C2 as shown in FIG. 5, of which we will focus on the intersection point the side closer to the first sensor 41. The position of this intersection point can be easily acquired by known geometric computations. The position of the first sensor 41 is known. The controller unit 5 acquires a planar vector that represents the misalignment between the focused intersection point and the position of the first sensor 41. This planar vector is indicated by the white arrow in FIG. 5. This misalignment can be considered equal to the positional misalignment between the center 10$c$ of the hand 10 and the center 2$c$ of the wafer 2.

Since the detection of the positional misalignment of the wafer 2 by the second sensor 42 is substantially the same as that by the first sensor 41, it will be described briefly without showing it in the drawings. Similarly to the first sensor 41, the second sensor 42 can detect the passage of the outer edge of the wafer 2 twice. At each of the two passage times, the controller unit 5 computes the position of the center 10$c$ of the hand 10.

In the two-dimensional plane described above, consider two virtual circles centered at the two centers 10$c$ acquired above with respect to the hand 10, whose diameters are equal to the diameter of the wafer 2. There are two intersection points of the two virtual circles, and of the two intersection points, we focus on the intersection point the side closer to the second sensor 42. The position of the second sensor 42 is known. The controller unit 5 acquires a planar vector that represents the misalignment between the focused intersection point and the position of the second sensor 42. This misalignment can be considered equal to the positional misalignment between the center of the hand 10 and the center of the wafer 2.

The controller unit 5 computes an average value of the two acquired planar vectors. The average value of these vectors corresponds to the planar vector (ox, oy) which will be described later. By calculating the average, the positional misalignment of the wafer 2 with respect to the hand 10 can be determined with high accuracy.

One of the first sensor 41 and the second sensor 42 may be omitted. Instead of the first sensor 41 and the second sensor 42, a camera capable of capturing images of the wafer 2 being transferred by the robot 1 from above may be provided, and image recognition processing of the image data captured by the camera may be used to acquire the misalignment between the hand 10 and the wafer 2.

The controller unit 5 has a misalignment amount acquirer 51 and a controller 52, as shown in FIG. 3. The controller unit 5 is configured as a known computer equipped with a CPU, a ROM, a RAM, and an auxiliary storage device. The auxiliary storage device is configured as, for example, an HDD, an SSD, or the like. The auxiliary storage device stores robot control programs and the like to realize the control method according to this disclosure regarding the joint motors 12$a$, 12$b$, 12$c$. The cooperation of these hardware and software allows the controller unit 5 to operate as the misalignment amount acquirer 51 and the controller 52, etc.

The misalignment amount acquirer 51 acquires a misalignment amount of the wafer 2 based on the detection results of the first sensor 41 and the second sensor 42 included in the positional misalignment detector 4, as described above. The misalignment amount can be expressed, for example, as a planar vector (ox, oy).

The controller 52 outputs command values to the respective drive motors that drive the various parts of the robot 1 described above, in accordance with a predetermined movement program or a movement command input by the user, to control the drive motors and to move the hand 10 to a predetermined command position. The drive motors include the joint motors 12$a$, 12$b$, 12$c$ described above as well as the electric motors (not shown) to displace the elevation shaft 14 vertically.

The controller 52 has a movement destination position modifier 53 and a velocity corrector 54.

The essential position of the hand 10 when placing the wafer 2 is the position where its center 10$c$ coincides with the reference position 7$p$ of the substrate processing chamber 7. However, if there is positional misalignment of the wafer 2 with respect to the hand 10 for some reason, this positional misalignment becomes the positional misalignment of the wafer 2 with respect to the reference position 7$p$ of the substrate processing chamber 7 as it is. Therefore, the movement destination position modifier 53 modifies the position of the hand 10 when placing the wafer 2, based on the misalignment amount input from the misalignment amount acquirer 51. The misalignment amount is information indicating the positional misalignment of the wafer 2 (positional misalignment information).

The modification is performed so as to cancel the positional misalignment described above. Specifically, the modification can be achieved by inverting the acquired planar vector (ox, oy) indicating the misalignment amount of the wafer 2, and adding the inverted planar vector (−ox, −oy) to the coordinates of the transfer destination of the hand 10.

Figure 6:
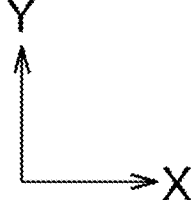
FIG. 6 is a conceptual diagram illustrating a modification of a position of a hand when it places the wafer.

Hereafter, the inverted planar vector may be referred to as the position correction vector. In FIG. 6, the position correction vector (Δx1, Δy1) is indicated by white arrows. Here, Δx1=−ox and Δy1=−oy.

In the following, with respect to the hand 10, the position of the movement destination before the modification may be referred to as the position before the modification, and the position of the movement destination after the modification may be referred to as the position after the modification. In FIG. 6, the coordinates of the position before the modification are represented by (x1, y1) and the coordinates of the position after the modification are represented by (x1+Δx1, y1+Δy1).

In FIG. 6, the coordinates of the position before the modification (x1, y1) coincide with the coordinates of the reference position 7$p$ of the substrate processing chamber 7 that are taught in advance. However, this is for convenience to make the explanation of the positional modification easier to understand, and in this embodiment, the position before the modification is defined as a different position. This will be described later.

The controller 52 moves the hand 10 to the position after the modification, and when the movement is complete, the hand 10 places the wafer 2 in the substrate processing chamber 7. This allows the wafer 2 to be set in the substrate processing chamber 7 with the center 2c of the wafer 2 coincide with the reference position 7p of the substrate processing chamber 7.

Next, the velocity control of the hand 10 performed by the velocity corrector 54 when positional misalignment is detected by the positional misalignment detector 4 will be described.

As mentioned above, the positional misalignment of the wafer 2 with respect to the hand 10 is detected while the wafer 2 is being transferred to the substrate processing chamber 7 as the transfer destination. The movement destination position modifier 53 changes the movement destination position of the hand 10 from the position before the modification to the position after modification, during the transfer of the wafer 2 by the hand 10. This allows the wafer 2 to be set in the substrate processing chamber 7 at an accurate position while preventing a decrease in transfer efficiency.

Now, consider the moment when the position correction vector described above is acquired and the movement destination of the hand 10 is modified. The position correction vector is acquired almost simultaneously with the first sensor 41 and the second sensor 42 detecting the passage of the outer edge of the wafer 2 a total of four times. In the examples shown in FIGS. 4 and 5, the two detections of the outer edge of wafer 2 by the second sensor 42 are completed between the timing of FIG. 4 and FIG. 5. Therefore, the position correction vector is, in effect, acquired at the time point in FIG. 5 when the first sensor 41 detects the passage of the outer edge of the wafer 2 for the second time.

The position of the center of the hand 10 at the time point in FIG. 5 is indicated in FIG. 6 by the reference sign P0. If the hand 10 has to move from the position P0 at the time point of FIG. 5 to the reference position 7p as the movement destination by (mx, my) before the modification of the movement destination of the hand 10, after the modification, the hand 10 will have to move from the current position P0 to the modified position by (mx+Δx1, my+Δy1). Here, mx>0, my>0, Δx1>0, and Δy1>0.

Figure 7:
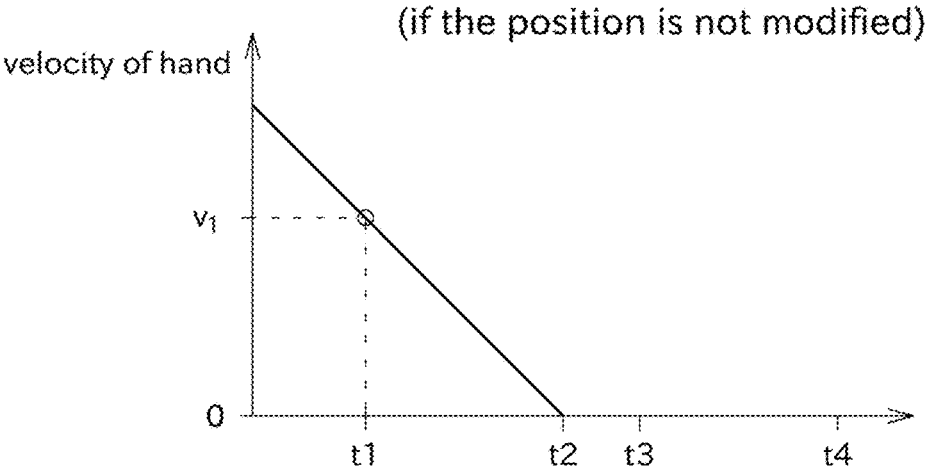
FIG. 7 is a graph illustrating a velocity of the hand in the case where the movement destination position of the hand is not modified.

Consider the case where the velocity of the hand 10 was planned to be controlled as shown in the graph of FIG. 7 before the modification of the movement destination of the hand 10. The graph in FIG. 7 shows the velocity of the hand 10 in the direction of travel.

FIG. 7 shows a situation where the hand 10 is considerably closer to the reference position 7p. Time t1 shown in FIG. 7 corresponds to the timing when the center of the hand 10 is at the position indicated by the reference sign P0 in FIG. 6. As shown in the graph of FIG. 7, the velocity of the center of the hand 10 is controlled to decrease continuously and linearly from before time t1.

If the movement destination is not modified at time t1, the velocity of the center of the hand 10 continues to decrease and reaches zero at time t2. The center of the hand 10 at the time t2 coincides with the reference position 7p, which is the movement destination before the modification.

As will be described in detail later, the vertical axis in FIG. 7 refers to the magnitude of the velocity vector. An integral value of the magnitude of this velocity vector from time t1 to time t2 is equal to the distance from position P0 to the reference position 7p, i.e., $\sqrt{(mx^2+my^2)}$.

Next, consider the case where the movement destination position is modified at time t1. As the position is corrected, the velocity corrector 54 adds the time function of the velocity correction value shown in FIG. 8 to the time function of the velocity of the center of the hand 10 before correcting shown in FIG. 7.

The time function of the velocity regarding the center of the hand 10 is actually a vector function. The vertical axis of the graph in FIG. 7 shows the magnitude of the vector. The direction of this velocity vector is constant, in the same direction as the arrow from position P0 to the reference position 7p in FIG. 6, and only the magnitude varies as shown in FIG. 7.

Figure 8:
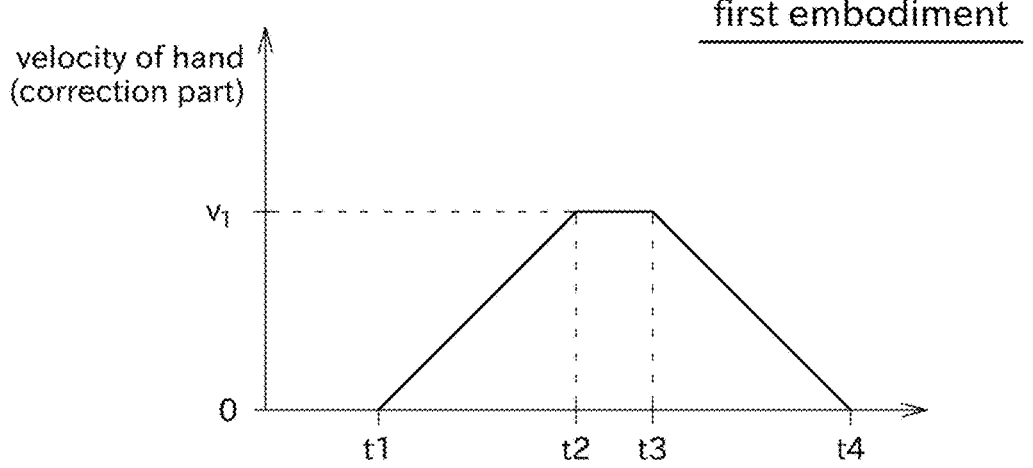
FIG. 8 is a graph illustrating a velocity correction function of a velocity correction control according to a first embodiment in the case where the movement destination position of the hand is modified.

The time function of the velocity correction value is similarly actually a vector function. The vertical axis of the graph in FIG. 8 shows the magnitude of the vector. The direction of this velocity correction vector is constant, in the same direction as the position correction vector shown by the white arrow in FIG. 6, and only the magnitude varies as shown in FIG. 8.

As shown in FIG. 8, the magnitude of the velocity correction vector changes trapezoidally over time.

Specifically, between time t1 and time t2, the magnitude of the velocity correction vector increases linearly from zero to velocity v1. The velocity v1 is the magnitude of the velocity of the center of the hand 10 at time t1. The slope of the increase in magnitude of the velocity correction vector between time t1 and time t2 is equal to the absolute value of the slope of the decrease in magnitude of the velocity vector before the correcting, shown in FIG. 7.

Between time t2 and time t3, the magnitude of the velocity correction vector remains v1.

Between time t3 and time t4, the magnitude of the velocity correction vector decreases linearly from v1 to zero. The slope of the decrease in magnitude of the velocity correction vector between time t3 and time t4 is equal to the slope of the decrease in magnitude of the velocity vector before the correcting, shown in FIG. 7.

An integral value of the magnitude of the velocity correction vector shown in FIG. 8 from time t1 to time t4 is equal to the magnitude of the position correction vector. The magnitude of the position correction vector is specifically $\sqrt{(\Delta x1^2+\Delta y1^2)}$. Conversely, the velocity corrector 54 determines the time t3 and time t4 shown in FIG. 8 so that the above integral value is equal to the magnitude of the position correction vector. The larger the magnitude of the position correction vector, the longer the time between time t3 and time t4.

Figure 9:
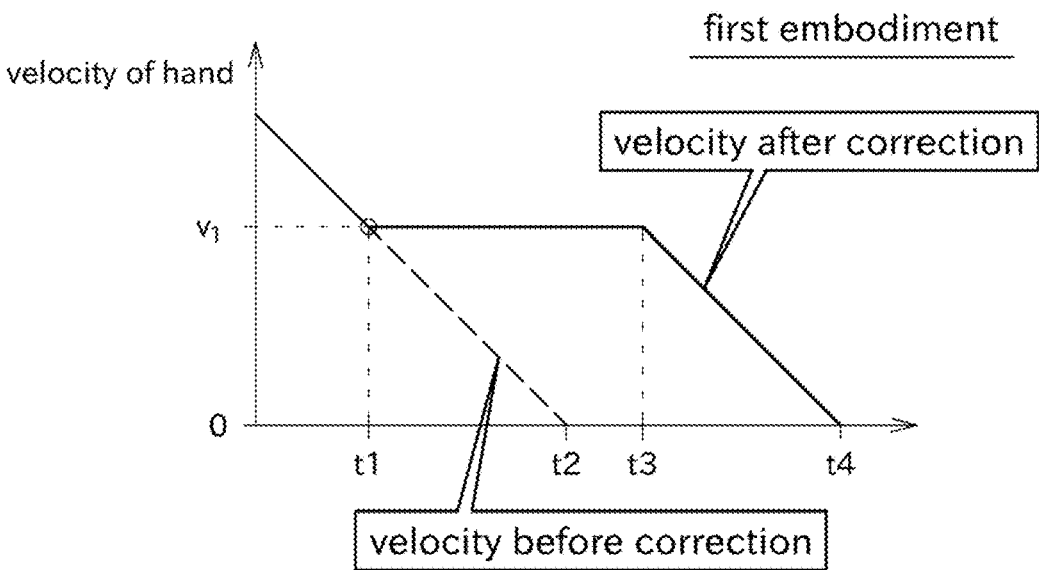
FIG. 9 is a graph conceptually illustrating correction of the velocity of the hand.

FIG. 9 is a graph conceptually illustrating the correction of the velocity of the hand 10.

The vertical axis of the graph in FIG. 9 is the magnitude of the vector shown in FIG. 7 plus the magnitude of the vector shown in FIG. 8. Between time t1 and time t2, the magnitude of the vector shown in FIG. 7 decreases linearly from v1 to zero, while the magnitude of the vector shown in FIG. 8 increases linearly from zero to v1. Thus, between time t1 and time t2, the sum of the magnitudes of the two vectors is constant at v1.

The velocity corrector 54 corrects the velocity of the hand 10 by adding the function of the vectors for velocity correction described in FIG. 8 to the function of the velocity vectors described in FIG. 7. A vector that is a composite of the two vectors represents the velocity of the center of the hand 10 after the correcting.

As noted above, the velocity vectors described in FIG. 7 and the vector for velocity correction described in FIG. 8 have different directions. Therefore, the sum of the magnitudes of the two vectors and the magnitude of the composite vector do not match. However, since mx<0, my<0, Δx1<0, and $\Delta y1<0$, the orientations of the two vectors are not so different. That is, the magnitude of the composite vector of the two vectors is similar to the sum of the magnitudes of the respective vectors.

Therefore, as shown for convenience in the graph in FIG. 9, the velocity of the center of the hand 10 after the correcting is approximately constant between time t1 and time t2 at a velocity near v1. The corrected velocity of the center of the hand 10 is also constant at velocity v1 between time t2 and time t3. Between time t3 and time t4, the corrected velocity of the center of the hand 10 decreases with a slope equal to that before the correcting, approaching zero. The velocity of the hand 10 reaches zero at time t4.

This control allows the movement destination of the hand 10 to be corrected while preventing excessive acceleration of the hand 10.

In the above control, the correction of the velocity in the X-axis direction and the correction of the velocity in the Y-axis direction are linked to each other according to the function indicated in FIG. 8. However, the correction of the velocity in the X-axis direction based on the modification of the position in the X-axis direction $\Delta x1$ and the correction of the velocity in the Y-axis direction based on the modification of the position in the Y-axis direction $\Delta y1$ may be performed separately. Usually, the modification amount $\Delta x1$ of the position in the X-axis direction and the modification amount $\Delta y1$ of the position in the Y-axis direction are different from each other. In the case where the velocity correction is performed separately for the X-axis and the Y-axis, the length of time that the velocity is corrected to be constant in the X-axis direction and the length of time that the velocity is corrected to be constant in the Y-axis direction are different from each other. Therefore, the timing at which the velocity correction by the velocity corrector 54 is completed is different for the X-axis component and the Y-axis component.

Next, the setting regarding the movement destination of the hand 10 before the modification will be described in detail.

With respect to the modification of the movement destination of the hand 10, the explanation according to FIG. 6 assumes that the movement destination (x1, y1) of the hand 10 before the correcting is set to match the reference position 7p of the substrate processing chamber 7 which is taught in advance.

However, the positional misalignment of the wafer 2 with respect to the hand 10 can occur in various directions and magnitudes. Therefore, with respect to the vectors (mx+$\Delta x1$, my+$\Delta y1$) indicating the modified movement of position, the difference $\Delta x1$ is not necessarily positive and the difference $\Delta y1$ is not necessarily positive. The correction of velocity described in FIG. 9 cannot be performed when the difference $\Delta x1$ is negative and cannot be performed when the difference $\Delta y1$ is negative, since this correction assumes mx<0, my<0, $\Delta x1<0$, and $\Delta y1<0$.

Figure 10:
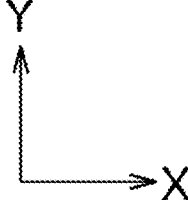
FIG. 10 is a plan view illustrating a provisional target position, which is set for convenience as a movement destination position of the hand before the modification.

To solve this problem, in this embodiment, the position before the modification is defined as the predetermined provisional target position P1 shown in FIG. 10, which is different from the reference position 7p of the substrate processing chamber 7 which is taught in advance. The provisional target position P1 is defined so that when a range in which the positional misalignment of the wafer 2 can be corrected is drawn with reference position 7p as the center, the provisional target position is opposite to the direction D1 in which the hand 10 moves to transport the wafer 2 from the storage container 6 to the reference position 7p in the substrate processing chamber 7, with respect to the range.

FIG. 10 shows an example of the position misalignment correction possible range A1 and the provisional target position P1.

The above-described direction D1 in which the hand 10 transfers the wafer 2 is in the positive direction both in the X-axis direction and in the Y-axis direction. On the other hand, the X coordinate of the provisional target position P1 is on the negative side compared to the minimum value of the X coordinate of the position misalignment correction possible range A1, and the Y coordinate of the provisional target position P1 is on the negative side compared to the minimum value of the Y coordinate of the position misalignment correction possible range A1. By setting the position of the movement destination of the hand 10 before the correcting to the provisional target position P1 as described above, the two deviations $\Delta x1$ and $\Delta y1$ are prevented from becoming negative, no matter in which direction and with which magnitude the positional misalignment of the wafer 2 with respect to the hand 10 occurs within the position misalignment correction possible range A1. Thus, the correction of velocity described in FIG. 9 can be reliably applied.

The provisional target position P1 can be determined as needed to satisfy the above conditions. However, it is necessary that the first sensor 41 and the second sensor 42 can detect the passage of the outer edge of the wafer 2 a total of four times before the center 10c of the hand 10 reaches the provisional target position P1.

As described above, the controller unit 5 of the substrate transfer robot according to this embodiment controls the robot 1 including the hand 10, the joints c1, c2, c3, and the joint motors 12a, 12b, 12c. The hand 10 can hold the wafer 2. The joints c1, c2, c3 are arranged so that their axes are oriented vertically. The joint motors 12a, 12b, 12c drive the joints c1, c2, c3. The controller unit 5 modifies the target position of the hand 10 when the hand 10 places the wafer 2 at the transfer destination, based on the positional misalignment information indicating the misalignment of the wafer 2 held by the hand 10. To change the position at which the hand 10 places the wafer 2 to the target position after the modification, the controller unit 5 performs the first velocity control and the second velocity control. In the first velocity control performed from time t1 to time t3, the velocity of the hand 10 that is approaching the target position before the modification with the velocity decreasing is made constant by the correcting. In the second velocity control performed from time t3 to time t4, the velocity of the hand 10 is made to decrease by a slope equal to the slope of the velocity of the hand 10 immediately before the first velocity control, and the hand 10 is stopped at the target position after the modification. As the magnitude of change in the target position due to the modification (i.e., the magnitude of the position correction vector) increases, the time during which the first velocity control is performed increases.

This allows the hand 10 to place the wafer 2 at the accurate position of the substrate processing chamber 7 by eliminating the positional misalignment while suppressing a velocity fluctuation of the hand 10.

In the controller unit 5 of the robot 1 of this embodiment, the target position before the modification is the provisional target position P1, which is different from the reference position 7p of the substrate processing chamber 7 which is taught in advance. The provisional target position P1 is set to be located on the side opposite to the direction D1 in which the hand 10 moves to transfer the wafer 2 to the reference position $7p$ from another position, in relation to the position correctable range centered at the reference position $7p$.

This allows the hand 10 to eliminate the positional misalignment and place the wafer 2 in the exact position of the substrate processing chamber 7 while suppressing the velocity fluctuation of the hand 10, no matter in what direction the misalignment of the wafer 2 with respect to the hand 10 occurs.

Next, the second embodiment will be described. In description of this embodiment, members identical or similar to those of the above-described embodiment are given the same corresponding reference signs on the drawings, and descriptions thereof may be omitted.

Figure 11:
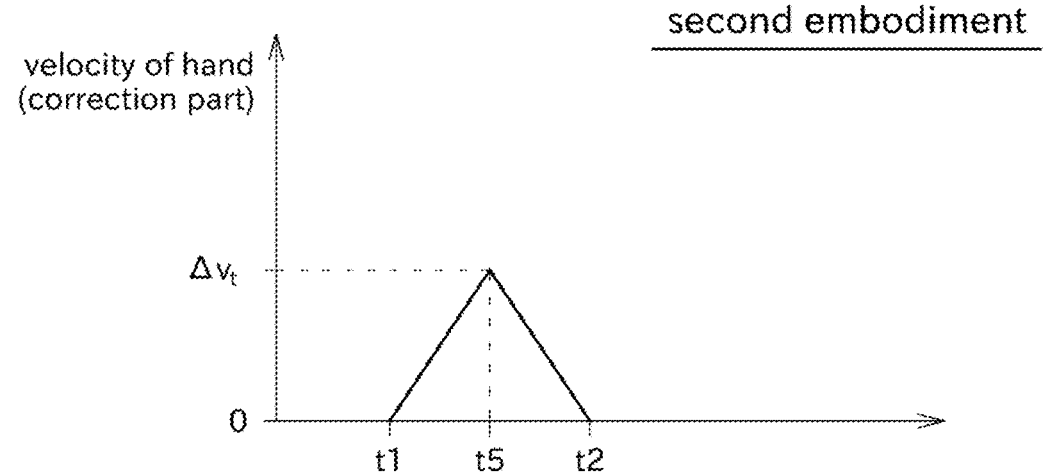
FIG. 11 is a graph illustrating a velocity correction function of a velocity correction control according to a second embodiment.
Figure 12:
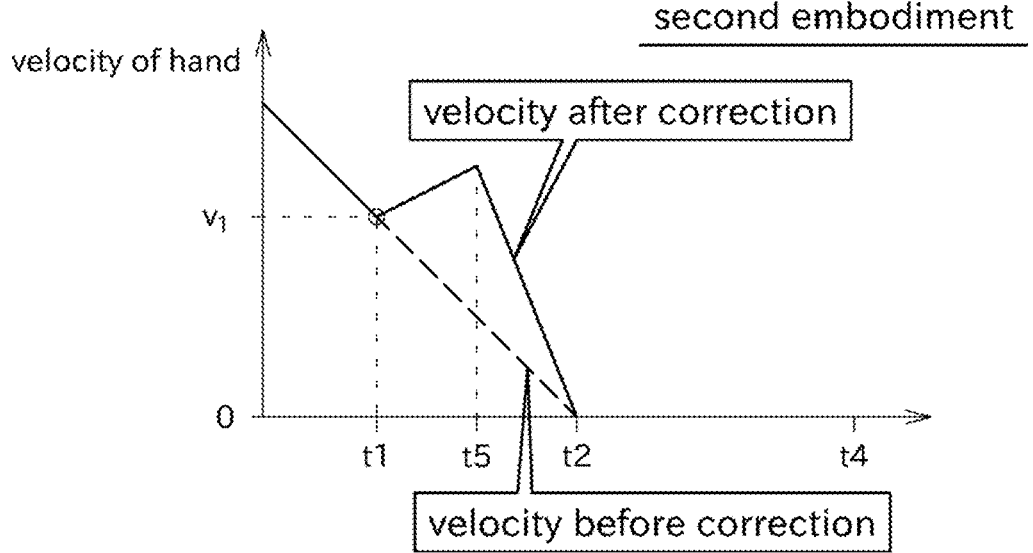
FIG. 12 is a graph conceptually illustrating the correction of the hand velocity in the second embodiment of the velocity correction control.

In this embodiment, the correction method performed by the velocity corrector 54 differs from the first embodiment described above. In this embodiment, the velocity corrector 54 adds a velocity correction function, which is a time function of the velocity correction value, to the velocity of the hand 10 before the correcting as shown in the graph in FIG. 7. The velocity correction function is shown in FIG. 11. As a result, the velocity of the hand 10 is controlled as shown by the solid line in FIG. 12.

The velocity correction function has a shape similar to a triangular wave pulse, as shown in FIG. 11. This pulse starts at time t1 and ends at time t2.

The velocity correction function consists of a first period during which the velocity correction value increases and a second period during which the velocity correction value decreases. The switch from the first period to the second period occurs at time t5. The length of the first period is equal to the length of the second period.

In the first period, the velocity correction value is zero at time t1 and increases linearly from zero as time elapses. At time t5, the velocity correction value is $\Delta v_t$.

In the second period, the velocity correction value is the value $\Delta v_t$ at time t5 and decreases linearly as time elapses. At time t2, the velocity correction value is zero.

By adding this velocity correction function to the velocity before the correcting, the velocity of the hand 10 can be corrected.

The velocity correction function shown in FIG. 11 is a vector function, similar to the velocity correction function described in FIG. 8 in the first embodiment above. Similar to the first embodiment, the velocity vector described in FIG. 7 and the vector for velocity correction described in FIG. 11 have different directions.

In this embodiment, the pulse width (length of time) of the triangular wave pulse of the velocity correction function does not change even if the amount of position correction (i.e., the magnitude of the position correction vector) changes. Instead, the height of the triangle wave pulse of the velocity correction function, in other words, the velocity correction value $\Delta v_t$ at time t5, changes according to the amount of the position correction $\Delta x1$.

Unlike the control of the first embodiment described above, the control of this embodiment does not change the transferring time regardless of the magnitude of the position modification amount. Therefore, the transfer throughput reduction can be suppressed and a fluctuation in throughput can be prevented.

In this embodiment, the provisional target position P1 described in FIG. 10 is not used as the movement destination before the modification. The reference position $7p$ which is taught in advance is used as the movement destination before the modification of the hand 10.

As explained above, to change the position at which the hand 10 places the wafer 2 to the target position after the modification, the controller unit 5 of the robot 1 in this embodiment adds the velocity correction function, which is a time function of the velocity correction value, to the velocity of the hand 10. The velocity correction function includes the first period and the second period. The first period is the period from time t1 to time t5. The second period is the period from time t5 to time t2. In the first period, the velocity correction value is zero at the start time point of the correcting (time t1) and increases linearly from zero as time elapses. In the second period, the velocity correction value decreases linearly from the value $\Delta v_t$ at the end time point of the first period to zero at the end time point of the correcting as time elapses. The end time point of the correcting is the same time as the time point at which the velocity of the hand 10 before the correction reaches zero (time t2). As the magnitude of the position correction vector increases, the slope of the velocity increasing in the first period becomes steeper and the slope of the velocity decreasing in the second period becomes steeper.

This allows the wafer 2 to be transferred to the accurate position by preventing positional misalignment while preventing a decrease in transfer throughput.

In the controller unit 5 of the robot 1 of this embodiment, the target position before the correcting is the taught position which is taught in advance, i.e., the reference position $7p$.

This allows the position where the wafer 2 is placed to be modified from the taught position.

While some preferred embodiments of the present disclosure have been described above, the foregoing configurations may be modified, for example, as follows. The modification can be singly made and any combination of several modifications can be made.

When the velocity correction of the first embodiment is performed, instead of setting the movement destination before the correcting to the provisional target position P1, it can be set to the reference position $7p$ which is the essential movement destination. If the difference $\Delta x1$ or the difference $\Delta y1$ is negative, a velocity correction by a method other than the above can be performed as appropriate.

The user may be able to select between the velocity correction of the first embodiment and the velocity correction of the second embodiment, for example, by setting the user.

The transfer destination of the wafer 2 by the robot 1 is not limited to the substrate processing chamber 7, but may be another location, such as a load lock room, for example.

The number of joints that the manipulator 11 has, whose axes are oriented along a vertical direction, is not limited to three, but may be one, two, or four or more.

The directions of the X and Y axes in the coordinate system are arbitrary. For example, the X-axis may be defined so that the left side in FIG. 10 is in the positive direction, or the Y-axis may be defined so that the bottom side is in the positive direction.

The control described in the above embodiments can also be applied when the robot 1 transports a substrate other than the wafer 2.

The functions of the controller unit 5 and other elements disclosed in the present disclosure may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. In the present disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

The invention claimed is:

1. A control device of a substrate transfer robot, the substrate transfer robot comprising:

a hand capable of holding a substrate;

a joint whose axis is oriented in a vertical direction; and a joint motor that drives the joint, wherein the control device modifies a target position of the hand when the substrate is placed at a transfer destination, based on positional misalignment information indicating misalignment of the substrate held by the hand, to change a position at which the hand places the substrate to the target position after the modification, the control device performs:

first velocity control to make velocity of the hand that is approaching the target position before the modification with the velocity decreasing constant by correcting; and second velocity control to make the velocity of the hand decrease by a slope equal to a slope of the velocity of the hand immediately before the first velocity control and to stop the hand at the target position after the modification, and time during which the first velocity control is performed increases as a magnitude of change in the target position due to the modification increases.

2. The control device for the substrate transfer robot according to claim 1, wherein the target position before the correcting is a provisional target position different from a taught position which is taught in advance, and the provisional target position is set to be located on a side opposite to a direction in which the hand moves to transfer the substrate to the taught position from another position, in relation to the taught position.

3. A control device of a substrate transfer robot, the substrate transfer robot comprising:

a hand capable of holding a substrate;

a joint whose axis is oriented in a vertical direction; and a joint motor that drives the joint, wherein the control device modifies a target position of the hand when the substrate is placed at a transfer destination, based on positional misalignment information indicating misalignment of the substrate held by the hand, to change a position at which the hand places the substrate to the target position after the modification, the control device adds a velocity correction function, being a time function of a velocity correction value, to velocity of the hand, the velocity correction function includes:

a first period during which the velocity correction value is zero at a start time point of correcting and increases linearly from zero as time elapses; and a second period during which the velocity correction value decreases linearly from the velocity correction value at an end time point of the first period to zero at an end time point of the correcting as time elapses, the end time point of the correcting is simultaneous with a time point at which the velocity of the hand before the correcting reaches zero, and a slope of the velocity increasing in the first period becomes steeper and a slope of the velocity decreasing in the second period becomes steeper as a magnitude of change in the target position due to the modification increases.

4. The control device for the substrate transfer robot according to claim 3, wherein the target position before the correcting is a taught position which is taught in advance.

5. A control method of a joint motor of a substrate transfer robot, the substrate transfer robot comprising:

a hand capable of holding a substrate;

a joint whose axis is oriented in a vertical direction; and the joint motor that drives the joint, wherein a target position of the hand when the substrate is placed at a transfer destination is modified based on positional misalignment information indicating misalignment of the substrate held by the hand, to change a position at which the hand places the substrate to the target position after the modification:

first velocity control to make velocity of the hand that is approaching the target position before the modification with the velocity decreasing constant by correcting; and second velocity control to make the velocity of the hand decrease by a slope equal to a slope of the velocity of the hand immediately before the first velocity control and to stop the hand at the target position after the modification, are performed, and time during which the first velocity control is performed increases as a magnitude of change in the target position due to the modification increases.

6. A control method of a joint motor of a substrate transfer robot, the substrate transfer robot comprising:

a hand capable of holding a substrate;

a joint whose axis is oriented in a vertical direction; and the joint motor that drives the joint, wherein a target position of the hand when the substrate is placed at a transfer destination is modified based on positional misalignment information indicating misalignment of the substrate held by the hand, to change the position at which the hand places the substrate to the target position after the modification, a velocity correction function, being a time function of a velocity correction value, is added to velocity of the hand, the velocity correction function includes:

a first period during which the velocity correction value is zero at a start time point of correcting and increases linearly from zero as time elapses; and a second period during which the velocity correction value decreases linearly from the velocity correction value at an end time point of the first period to zero at an end time point of the correcting as time elapses, the end time point of the correcting is simultaneous with a time point at which the velocity of the hand before the correcting reaches zero, and a slope of the velocity increasing in the first period becomes steeper and a slope of the velocity decreasing in the second period becomes steeper as a magnitude of change in the target position due to the modification becomes larger.

* * * * *